United States Patent
Kim

(10) Patent No.: US 10,529,939 B2
(45) Date of Patent: Jan. 7, 2020

(54) ORGANIC LIGHT-EMITTING DEVICE AND ORGANIC LIGHT-EMITTING DISPLAY DEVICE USING THE SAME

(71) Applicant: LG DISPLAY CO., LTD., Seoul (KR)

(72) Inventor: Su-Hyeon Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/826,121

(22) Filed: Nov. 29, 2017

(65) Prior Publication Data

US 2018/0151819 A1 May 31, 2018

(30) Foreign Application Priority Data

Nov. 30, 2016 (KR) .......................... 10-2016-0162379

(51) Int. Cl.
*H01L 51/50* (2006.01)
*H01L 27/32* (2006.01)

(52) U.S. Cl.
CPC ...... *H01L 51/5004* (2013.01); *H01L 27/3211* (2013.01); *H01L 51/5024* (2013.01); *H01L 51/5056* (2013.01); *H01L 51/5088* (2013.01); *H01L 51/5072* (2013.01); *H01L 2251/5384* (2013.01); *H01L 2251/552* (2013.01)

(58) Field of Classification Search
None
See application file for complete search history.

(56) References Cited

U.S. PATENT DOCUMENTS

| | | | | |
|---|---|---|---|---|
| 2010/0176380 A1* | 7/2010 | Jung | ...................... | C07D 213/30 257/40 |
| 2012/0121933 A1* | 5/2012 | Ma | ........................ | H01L 51/5036 428/704 |
| 2012/0235197 A1* | 9/2012 | Okuyama | ............ | H01L 51/5262 257/98 |
| 2012/0261653 A1* | 10/2012 | Okamoto | ............. | H01L 51/5004 257/40 |
| 2013/0009139 A1 | 1/2013 | Ohsawa et al. | | |
| 2013/0104987 A1* | 5/2013 | Wang | .................... | H01L 51/422 136/263 |
| 2015/0069352 A1* | 3/2015 | Kim | ..................... | H01L 51/5004 257/40 |
| 2015/0194624 A1* | 7/2015 | Jeong | ................... | H01L 51/5056 257/40 |
| 2015/0333296 A1* | 11/2015 | Lee | ...................... | H01L 51/5064 257/40 |
| 2016/0093823 A1 | 3/2016 | Seo et al. | | |
| 2017/0324055 A1* | 11/2017 | Ishisone | .............. | H01L 51/5028 |
| 2018/0108854 A1* | 4/2018 | Yamazaki | ........... | H01L 51/5016 |

FOREIGN PATENT DOCUMENTS

| | | |
|---|---|---|
| CN | 104752614 A | 7/2015 |
| TW | 200913776 A | 3/2009 |
| TW | 201401602 A | 1/2014 |
| TW | 201417371 A | 5/2014 |

* cited by examiner

*Primary Examiner* — Walter H Swanson
*Assistant Examiner* — Kien C Ly
(74) *Attorney, Agent, or Firm* — Birch, Stewart, Kolasch & Birch, LLP

(57) ABSTRACT

An organic light-emitting device is configured such that, in a plurality of stacks in which the optical distance is adjusted using the thickness of an emission layer, the structure of the emission layer is changed to reduce the drive voltage and increase the lifespan thereof, and an organic light-emitting display device using the same.

13 Claims, 6 Drawing Sheets

ORGANIC LIGHT-EMITTING DEVICE AND ORGANIC LIGHT-EMITTING DISPLAY DEVICE USING THE SAME

CROSS-REFERENCE TO RELATED APPLICATION

This application claims the priority benefit of Korean Patent Application No. 10-2016-0162379, filed on Nov. 30, 2016 in the Republic of Korea, which is hereby incorporated by reference as if fully set forth herein.

BACKGROUND OF THE INVENTION

Field of the Invention

The present invention relates to an organic light-emitting device, and more particularly, to an organic light-emitting device configured such that, in a plurality of stacks in which the optical distance is adjusted using the thickness of each emission layer in each stack, the structure of the emission layer is changed to reduce the drive voltage and increase the lifespan thereof, and an organic light-emitting display device using the same.

Discussion of the Related Art

Recently, with the advent of the information age, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered a competitive application because it does not require a separate light source and enables realization of a compact device design and vivid color display.

Such an organic light-emitting display device includes organic light-emitting devices that are independently driven on a per-sub-pixel basis. Each organic light-emitting device includes an anode, a cathode, and a plurality of organic layers provided between the anode and the cathode.

The organic layers include a hole injection layer, a hole transport layer, an organic emission layer, and an electrode transport layer, sequentially arranged from the anode. In the organic emission layer, electrons and holes are combined to produce excitons. When the excitons fall to the ground state, light is generated from the organic light-emitting device. The other layers assist in transporting holes or electrons to the organic emission layer.

Also, in the organic light-emitting display device, each sub-pixel is divided into red, green, and blue sub-pixels for color display. An organic emission layer having a color corresponding to the color of each sub-pixel is formed in each sub-pixel. Generally, a deposition method using a shadow mask has been used to form the organic emission layer.

Hereinafter, an organic light-emitting device having a general single-stack structure will be described.

FIG. 1 is a sectional view showing an organic light-emitting device having a general single-stack structure.

As shown in FIG. 1, in the organic light-emitting device having the general single-stack structure, the region of a substrate 10 is divided into red, green, and blue sub-pixels.

Each sub-pixel is provided with an anode 11, and a hole injection layer 12 and a hole transport layer 13 are sequentially provided on the anode 11.

Since the emission layers provided at respective color sub-pixels on the substrate have different wavelengths, however, the resonance conditions thereof are different from each other. Consequently, it is necessary to set the optimal distance for light emission differently between the anode and the cathode. To this end, for the red sub-pixel, the optical distance of which is to be set so as to be far from the anode, and the green sub-pixel, the optical distance of which is less than that of the red sub-pixel but is greater than that of the blue sub-pixel, a first auxiliary hole transport layer 14 and a second auxiliary hole transport layer 15, which have different heights, are provided on the hole transport layer 13.

An electron blocking layer 16 is commonly provided on the hole transport layer 13, including the first and second auxiliary hole transport layers 14 and 15, and a red-light emission layer 17, a green-light emission layer 18, and a blue-light emission layer 19 are provided for the respective sub-pixels.

Subsequently, an electron transport layer 20, an electron injection layer 21, and a second electrode 22 are commonly provided on each of the emission layers 17, 18, and 19.

In the organic light-emitting device having the general single-stack structure shown in FIG. 1, the efficiency of a single emission layer in the stack is limited, and the color gamut is insufficient. In recent years, therefore, a structure in which a plurality of stacks is provided on a per-color-sub-pixel basis to express color has been proposed.

In a device having a plurality of stacks to emit light having the same color, however, the optical distance must be defined differently from a single stack due to the plurality of stacks, whereby it is necessary to change the structure of the layers.

Up to now, light emission efficiency has not been sufficiently achieved using known materials or through the repetition of a single stack. Consequently, research is being conducted on a multi-stack structure having sufficient light emission efficiency.

SUMMARY OF THE INVENTION

Accordingly, the present invention is directed to an organic light-emitting device and an organic light-emitting display device using the same that substantially obviate one or more problems due to limitations and disadvantages of the related art.

An object of the present invention is to provide an organic light-emitting device configured such that, in a plurality of stacks in which the optical distance is adjusted using the thickness of an emission layer, the structure of the emission layer is changed to reduce the drive voltage and increase the lifespan thereof, and an organic light-emitting display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An organic light-emitting device according to the present invention and an organic light-emitting display device using the same are configured such that, in a dual-stack structure having improved light emission efficiency, the optical distance is adjusted using the thickness of emission layers, and two organic hosts are provided for each of the emission layers to achieve carrier balancing, thereby improving the lifespan thereof.

To achieve these objects and other advantages and in accordance with the purpose of the invention, as embodied and broadly described herein, an organic light-emitting device includes a first electrode and a second electrode opposite each other, a first stack and a second stack provided between the first electrode and the second electrode, each of the first and second stacks including a hole control layer, an emission layer, and an electron transport layer, which are sequentially stacked, and a charge generation layer provided between the first stack and the second stack, wherein the emission layers of the first and second stacks emit light have the same color, the emission layer of at least one of the first and second stacks including first and second organic hosts and a dopant, the lowest unoccupied molecular orbital (LUMO) energy level of the first organic host is at least 0.1 eV higher than the LUMO energy level of the second organic host, and the highest occupied molecular orbital (HOMO) energy level of the first organic host is equal to or higher than the HOMO energy level of the hole control layer, which abuts thereto, and is lower than the HOMO energy level of the second organic host.

The first organic host in the emission layer may be identical to a host component constituting the electron transport layer, which abuts the emission layer.

The first organic host may have a band gap of 3.0 eV to 3.5 eV.

The organic light-emitting device may further include a hole injection layer provided between the first electrode and the hole control layer of the first stack, and a hole transport layer provided between the charge generation layer and the hole control layer of the second stack.

The ratio of the first organic host to the second organic host may be 1:0.5 to 1:4.

The electron mobility of the first organic host may be higher than the electron mobility of the second organic host, and the electron mobility of the first organic host may be 1E-8 cm$^2$/V·s to 1E-6 cm$^2$/V·s.

The second organic host may be a Be derivative compound.

In another aspect of the present invention, an organic light-emitting display device includes a substrate having a red sub-pixel, a green sub-pixel, and a blue sub-pixel, a first electrode provided at each of the red, green, and blue sub-pixels, a second electrode opposite the first electrode, a first stack and a second stack provided between the first electrode and the second electrode of each of the sub-pixels, each of the first and second stacks including a hole control layer, an emission layer, and an electron transport layer, which are sequentially stacked, and a charge generation layer provided between the first stack and the second stack, wherein the emission layer of the first stack of at least one of the red, green, and blue sub-pixels includes first and second organic hosts and a dopant, the LUMO energy level of the first organic host is at least 0.1 eV higher than the LUMO energy level of the second organic host, and the HOMO energy level of the first organic host is equal to or higher than the HOMO energy level of the hole control layer, which abuts thereto, and is lower than the HOMO energy level of the second organic host.

The hole control layers and the electron transport layers of the first and second stacks, the charge generation layer, and the second electrode may be commonly provided for each of the red, green, and blue sub-pixels in a continuous manner.

The emission layers of the sub-pixels may include a first red-light emission layer and a second red-light emission layer located in the first stack and the second stack on the first electrode of the red sub-pixel to emit red light, a first green-light emission layer and a second green-light emission layer located in the first stack and the second stack on the first electrode of the green sub-pixel to emit green light, and a first blue-light emission layer and a second blue-light emission layer located in the first stack and the second stack on the first electrode of the blue sub-pixel to emit blue light.

The first red-light emission layer, the first green-light emission layer, and the first blue-light emission layer may have smaller thicknesses in that order, and the second red-light emission layer, the second green-light emission layer, and the second blue-light emission layer may have smaller thicknesses in that order.

The first organic host in the emission layer of the first stack may be identical to a host component constituting the electron transport layer, which abuts the emission layer of the first stack.

The at least one of the red, green, and blue sub-pixels having the first and second organic hosts and the dopant in the first stack may be configured such that the emission layer of the second stack is identical to the emission layer of the first stack.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
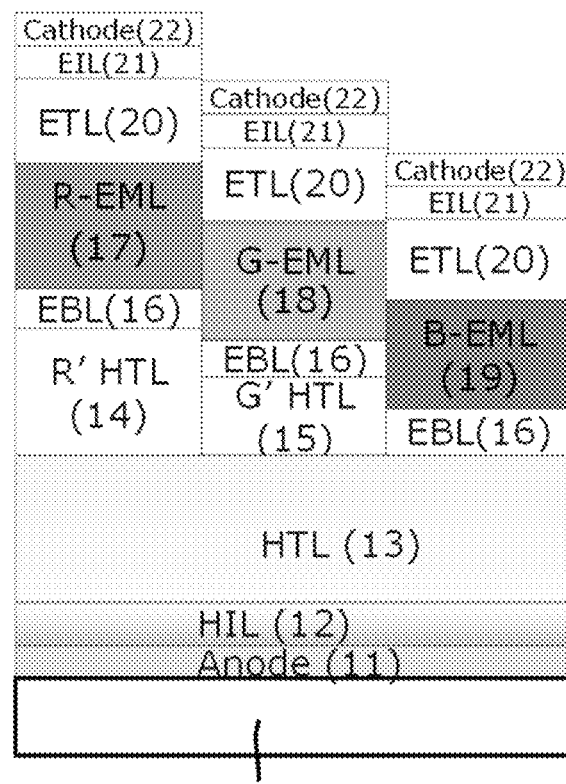
FIG. 1 is a sectional view showing an organic light-emitting device having a general single-stack structure.

The advantages and features of the present invention and the way of attaining them will become apparent with reference to embodiments described below in detail in conjunction with the accompanying drawings. The present invention, however, is not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limitative of the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used therewith.

In the description of the various embodiments of the present invention, when describing temporal relationships, for example, when the temporal relationship between two actions is described using "after", "subsequently", "next", "before", or the like, the actions may not occur in succession unless the term "immediately" or "directly" is used therewith.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkages therebetween and operation methods thereof are possible. These various embodiments may be performed independently of each other, or may be performed in association with each other.

In this specification, the "lowest unoccupied molecular orbital (LUMO) energy level" and the "highest occupied molecular orbital (HOMO) energy level" of any layer mean the LUMO energy level and the HOMO energy level of the material that occupies the greatest weight percentage of the corresponding layer, for example, a host material, unless they are referred to as the LUMO energy level and the HOMO energy level of a dopant material that is doped in the corresponding layer.

In this specification, the "HOMO energy level" may be the energy level that is measured via a cyclic voltammetry (CV) method, which determines the energy level from a potential value relative to a reference electrode having a known potential value. For example, the HOMO energy level of any material may be measured by using, as the reference electrode, ferrocene that has a known oxidation potential value and a known reduction potential value.

In this specification, the term "doped" means that a material of any layer, which has physical properties (e.g., N-type and P-type, or an organic material and an inorganic material) different from the material that occupies the greatest weight percentage of the corresponding layer, is added to the material accounting for the greatest weight percentage in an amount corresponding to a weight percentage of less than 10%. In other words, a "doped" layer means a layer in which a host material and a dopant material of any layer are distinguishable from each other in consideration of the weight percentages thereof. In addition, the term "undoped" refers to all cases excluding the case that corresponds to the term "doped". For example, when any layer is formed of a single material or is formed of a mixture of materials having the same or similar properties, the layer is included in an "undoped" layer. For example, when at least one of constituent materials of any layer is of a P-type and not all of the other constituent materials of the layer are of an N-type, the layer is included in the "undoped" layer. For example, when at least one of the constituent materials of any layer is an organic material and not all of the other constituent materials of the layer are an inorganic material, the layer is included in the "undoped" layer. For example, when all constituent materials of any layer are organic materials, at least one of the constituent materials is of an N-type, at least another constituent material is of a P-type, and the weight percent of the N-type material is less than 10% or the weight percent of the P-type material is less than 10%, the layer is included in the "doped" layer.

In this specification, an electroluminescence (EL) spectrum is calculated by multiplying (1) a photoluminescence (PL) spectrum, which applies the inherent characteristics of an emissive material such as a dopant material or a host material included in an organic emission layer, by (2) an outcoupling or emittance spectrum, which is determined by the structure and optical characteristics of an organic light-emitting element including the thicknesses of organic layers such as, for example, an electron transport layer.

In this specification, a stack means a unit structure that includes organic layers such as a hole transport layer and an electron transport layer and an organic emission layer interposed between the hole transport layer and the electron transport layer. The organic layers may further include a hole injection layer, an electron blocking layer, a hole blocking layer, and an electron injection layer, and may further include other organic layers according to the structure or design of an organic light-emitting device.

Figure 2:
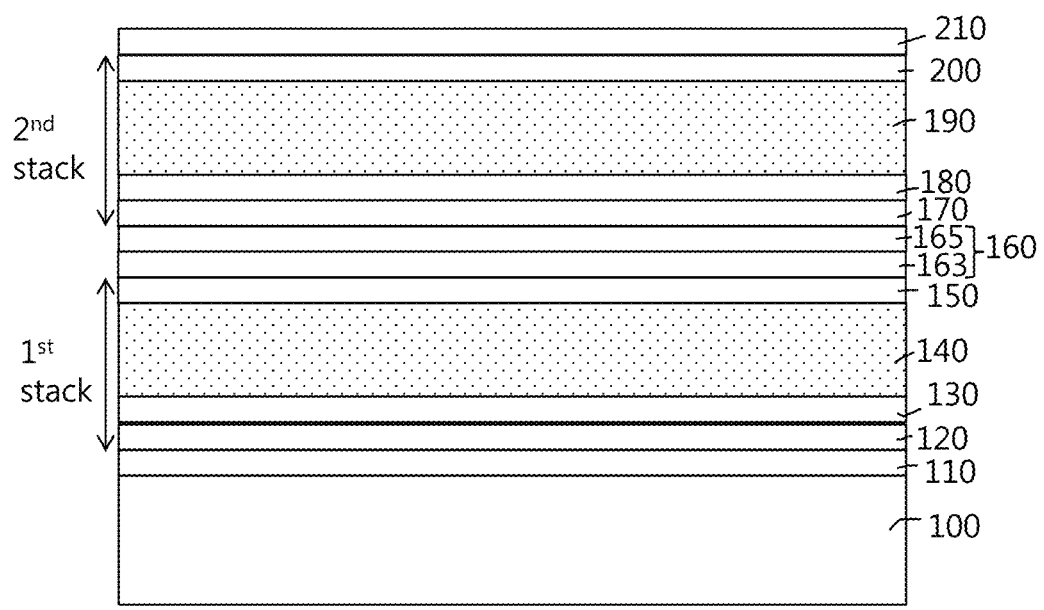
FIG. 2 is a sectional view showing an organic light-emitting device according to an embodiment of the present invention.
Figure 3:
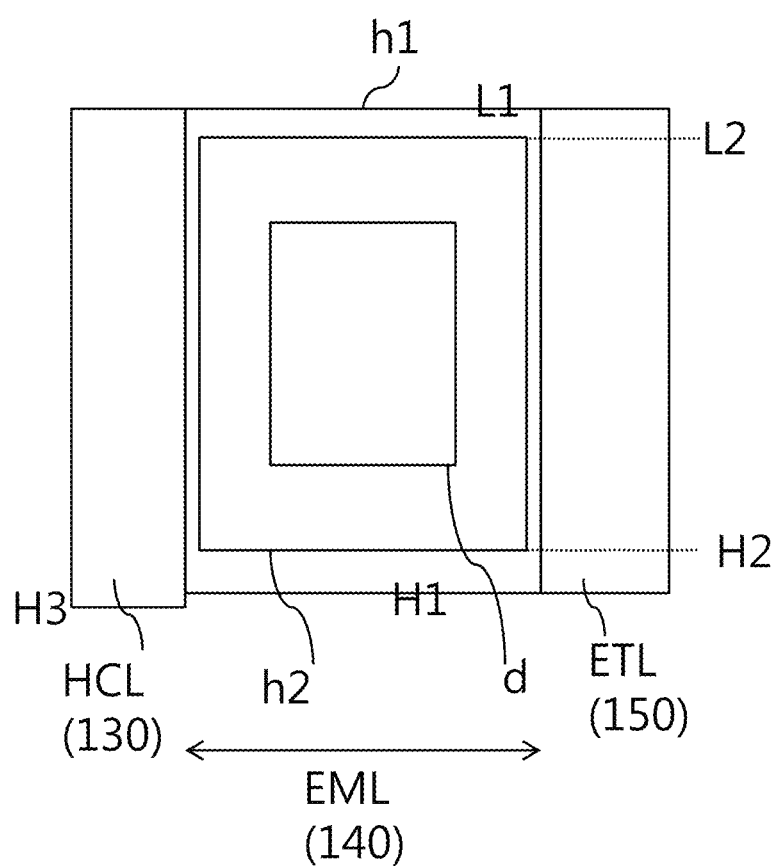
FIG. 3 is a band diagram showing an emission layer of FIG. 2 and layers adjacent thereto.
Figure 4:
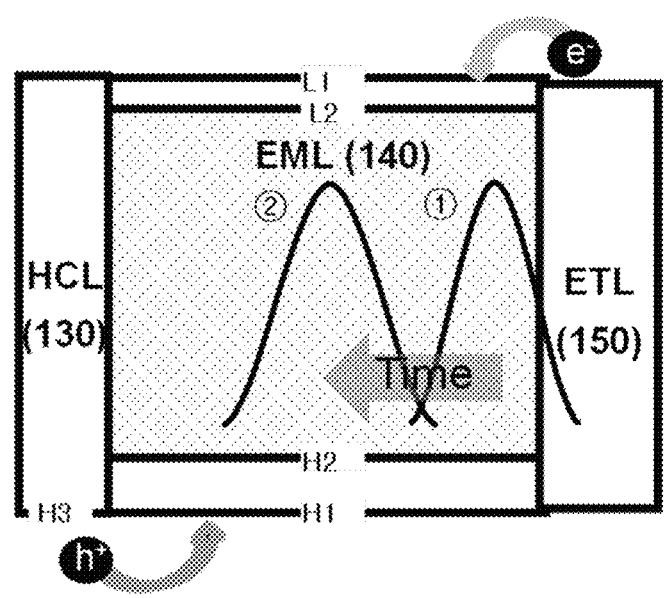
FIG. 4 is a view showing the change of a light emission distribution curve of the emission layer of FIG. 3 over time.

FIG. 2 is a sectional view showing an organic light-emitting device according to an embodiment of the present invention, FIG. 3 is a band diagram showing an emission layer of FIG. 2 and layers adjacent thereto, and FIG. 4 is a view showing the change of a light emission distribution curve of the emission layer of FIG. 3 over time. All the components of the organic light-emitting device according to all embodiments of the present invention are operatively coupled and configured.

As shown in FIG. 2, the organic light-emitting device according to the present invention includes a first electrode 110 and a second electrode 210 provided on a substrate 100 so as to oppose each other, a first stack provided between the first electrode 110 and the second electrode 210, the first stack including a first hole control layer 130, a first emission layer 140, and a first electron transport layer 150, which are sequentially stacked, and a second stack provided between the first electrode 110 and the second electrode 210, the second stack including a second hole control layer 180, a second emission layer 190, and a second electron transport layer 200, which are sequentially stacked, and a charge generation layer 160 provided between the first stack and the second stack.

The first and second emission layers 140 and 190 of the first and second stacks emit light having the same color. In such a dual-stack structure, light emission efficiency is higher and a color gamut is broader than in a single-stack structure.

Meanwhile, a hole injection layer 120 is provided between the first electrode 110 and the first hole control layer 130 of the first stack. In addition, a hole transport layer 170 may be further provided between the charge generation layer 160 and the second hole control layer 180 of the second stack.

In addition, an electron injection layer for assisting in the injection of electrons may be further provided between the second electron transport layer 200 and the second electrode 210. The electron injection layer may be formed so as to have a small thickness by depositing or sputtering LiF or $Li_2O$ or an alkaline metal or an alkaline earth metal, such as Li, Ca, Mg, or Sm, before the second electrode 210 is formed.

The charge generation layer 160 may have an np junction structure including an n-type charge generation layer 163 and a p-type charge generation layer 165. The n-type charge generation layer 163 supplies a number of electrons that is insufficient for the first stack, and the p-type charge generation layer 165 supplies a number of holes that is insufficient for the second stack.

As shown in FIGS. 3 and 4, the emission layer 140 or 190 of at least one of the first and second stacks includes first and second organic hosts h1 and h2 and a dopant d. The LUMO energy level L1 of the first organic host h1 is at least 0.1 eV higher than the LUMO energy level L2 of the second organic host h2. The HOMO energy level H1 of the first organic host h1 is equal to or higher than the HOMO energy level H3 of the first hole control layer 130 and is lower than the HOMO energy level H2 of the second organic host h2.

The first organic host h1 included in the emission layer 140 may be identical to the host component constituting the electron transport layer 150, which abuts the emission layer 140. FIGS. 3 and 4 show the band gap of the host of the electron transport layer 150. Depending on the circumstances, the electron transport layer 150 may further include a dopant, such as Liq, in an amount of 10% or less.

The reason that the organic light-emitting device according to the present invention uses the first organic host h1 made of the same material as the component constituting the electron transport layer 150, which abuts the emission layer 140, is as follows.

In a single-stack structure, a hole transport layer or an auxiliary hole transport layer has sufficient thickness to set the optical distance. In a two-stack structure, however, the optical distance is adjusted using the emission layer. The distance between the first and second electrodes 110 and 210, to which voltage is directly applied, is limited such that sufficient current flows in an organic layer provided between the first and second electrodes 110 and 210. In a two-stack structure, in which a plurality of emission layers is provided and the optical distance is controlled based on the thicknesses of the emission layers, therefore, it is difficult to increase the thicknesses of layers other than the emission layers. In the single-stack structure, the thickness of the hole transport layer is large.

In the organic light-emitting device according to the present invention, particularly the first stack, the distance between the first emission layer 140 and the first electrode 110 is short, whereby holes smoothly enter the first emission layer 140. However, the first emission layer 140 is far away from the second electrode 210, with the result that electrons are supplied relatively slowly. In the organic light-emitting device according to the present invention, therefore, the first organic host h1 having band gap characteristics identical or similar to those of the host of the first electron transport layer 150, which abuts the first emission layer 140, constitutes a portion of the host of the first emission layer 140 such that electrons can be supplied to the first emission layer 140 at a speed similar to the high entrance speed of holes. In this case, when the host (the main material) of the first electron transport layer 150 and the first organic host h1 are the same material, the ohmic contact of electrons is induced, whereby the effect of passage from the first electron transport layer 150 to the first emission layer 140 is achieved and drive voltage is reduced.

In addition, the speed at which holes enter the first emission layer 140 and the speed at which electrons enter the first emission layer 140 become similar, whereby carrier balancing is achieved. Consequently, the recombination rate of holes and electrons is improved, whereby efficiency is improved. In addition, electrons are prevented from accumulating at the interface between the first emission layer 140 and the first electron transport layer 150, whereby interface deterioration is prevented and thus the stability of the device is improved. Since the same material as the first electron transport layer 150, which abuts the first emission layer 140, is included as a host, a barrier may be reduced, whereby driving voltage may be reduced.

Meanwhile, the band gap of the first organic host h1 included in the first emission layer 140 is 3.0 eV to 3.5 eV. The band gap of the second organic host h2 is within the LUMO energy level L1 and the HOMO energy level H1 of the first organic host h1.

In addition, each of the first and second organic hosts h1 and h2 has electron transportability. The electron mobility of the first organic host h1 is 1E-8 $cm^2/V \cdot s$ to 1E-6 $cm^2/V \cdot s$, and the electron mobility of the second organic host h2 is 6E-10 $cm^2/V \cdot s$ to 9E-10 $cm^2/V \cdot s$, which is lower than that of the material of the electron transport layer of the single-stack structure shown in FIG. 1. That is, in the organic light-emitting device according to the present invention, only a material exhibiting high electron mobility is not used as the host material. The first organic host h1 is used to adjust the speed at which holes enter the emission layer and the speed at which electrons enter the emission layer so as to correspond to each other, and the second organic host h2 is provided to perform the function of the dopant d. The ratio of the materials is adjusted so as to perform optimal functions.

The main function of the first organic host h1 is to increase electron entrance speed. However, the present invention is not limited thereto. The first organic host h1 has the HOMO energy level H1 of the first organic host h1, which is equal to or higher than the HOMO energy level H3 of the first hole control layer 130, whereby holes are not prevented from entering the first emission layer 140 via the first hole control layer 130.

Meanwhile, in the organic light-emitting device according to the present invention, the ratio of the first organic host h1 to the second organic host h2 included in the first emission layer 140 may be 1:0.5 to 1:4. That is, it can be seen that efficiency is improved and drive voltage is reduced within a range in which the content of the first organic host h1 is 200% that of the second organic host h2, the two organic hosts have the same content, and the content of the first organic host h1 is ¼ that of the second organic host h2.

In addition, the second organic host h2 may be a Be derivative compound for operating the dopant included in the first emission layer 140.

The light emission distribution curve of FIG. 4 shows the case in which holes are injected rapidly due to the short distance between the first electrode and the first emission layer, whereby an emission zone is formed near the first electron transport layer 150 and the case in which the emission zone is formed near the central region of the first emission layer 140 due to the function of a first organic compound having electron transportability and a predetermined level or more of electron mobility after the lapse of a predetermined time. That is, when the organic light-emitting device according to the present invention is applied, the emission zone is shifted to the central region of the first emission layer 140 in order to prevent electrons or excitons from accumulating at the interface of the first emission layer 140, thereby increasing the lifespan of the device.

Meanwhile, the structures of the emission layer and the layers adjacent thereto in the first stack are shown in FIGS. 3 and 4. However, the present invention is not limited thereto. In the second stack, the second emission layer may also be configured to include the first and second organic compounds and the dopant having the above-described characteristics.

Even the case in which the second emission layer 190 of the second stack includes the first and second organic hosts h1 and h2 and the dopant having the above-described characteristics is effective. In the case in which the second emission layer 190 is thick and only the second organic host for assisting in the operation of the dopant is used, the movement of electrons in the second emission layer 190 is slower than the movement of holes in the second emission layer 190. However, in the case in which an electron transport material having electron mobility 2 to 4 orders of magnitude (100 times to 1000 times) higher than the second organic host h2 is used as the first organic host, electron transportability is improved, whereby drive voltage may be reduced through ohmic contact and carrier balancing may be optimized even in the second emission layer 190.

Meanwhile, in the host material of a well-known emission layer corresponding to a wavelength applied to the structure of the organic light-emitting device of FIG. 2 to assist in the operation thereof, the electron mobility of a host of a red-light emission layer (the second organic host of the present invention) is 6E-10 $cm^2/V \cdot s$ to 9E-10 $cm^2/V \cdot s$, and the electron mobility of a host of a green-light emission layer or a blue-light emission layer is 3E-4 $cm^2/V \cdot s$ to 6E-5 $cm^2/V \cdot s$. In other words, the electron mobility of the host of the red-light emission layer is relatively low, and the electron mobility of the host of each of the emission layers that emit other colors is relatively high. That is, when the structure of FIG. 2 is configured using only the well-known material, the electron mobility of the host of the red-light emission layer is lower than that of the host of each of the emission layers that emit other colors. In the organic light-emitting device according to the present invention, the first organic host h1, which has higher electron mobility than the second organic host h2, is further provided to increase electron transport speed so as to correspond to the rapid entrance of holes. Particularly, it is more effective for the organic red-light emission layer according to the present invention to have a relatively large thickness.

It can be seen from experiments that, when the emission layer including the first and second organic hosts and the dopant described above is applied to each of the first and second stacks, drive voltage is reduced and efficiency is improved.

In the above description, the structure of a single-color sub-pixel has been described.

Hereinafter, the structure of an organic light-emitting display device that realizes color expression will be described.

Figure 5:
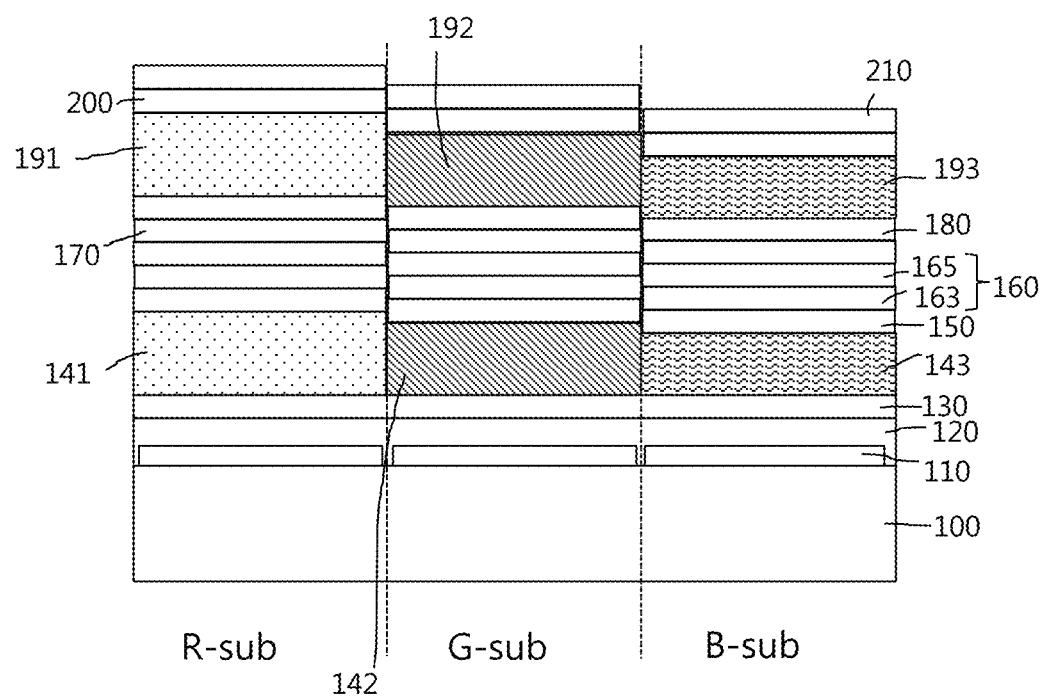
FIG. 5 is a sectional view showing a stack structure of one pixel in an organic light-emitting display device according to an embodiment of the present invention.

FIG. 5 is a sectional view showing a stack structure of one pixel in an organic light-emitting display device according to an embodiment of the present invention. All the components of the organic light-emitting display device according to all embodiments of the present invention are operatively coupled and configured.

As shown in FIG. 5, the organic light-emitting display device according to the present invention includes a substrate 100 having a red sub-pixel R-sub, a green sub-pixel G-sub, and a blue sub-pixel B-sub, a first electrode 110 provided at each of the red, green, and blue sub-pixels R-sub, G-sub, and B-sub, a second electrode 210 opposite the first electrode 110, a first stack and a second stack provided between the first electrode 110 and the second electrode 210 of each of the sub-pixels R-sub, G-sub, and B-sub, the first stack and the second stack respectively including hole control layers 130 and 180, emission layers 141/191, 142/192, and 143/193, and electron transport layers 150 and 200, which are sequentially stacked, and a charge generation layer 160 provided between the first stack and the second stack.

As described with reference to FIGS. 3 and 4, the emission layer of the first stack of at least one of the red, green, and blue sub-pixels R-sub, G-sub, and B-sub includes first and second organic hosts h1 and h2 and a dopant d. The LUMO energy level L1 of the first organic host h1 is at least 0.1 eV higher than the LUMO energy level L2 of the second organic host h2. The HOMO energy level H1 of the first organic host h1 is equal to or higher than the HOMO energy level H3 of the first hole control layer 130, which abuts the emission layer, and is lower than the HOMO energy level H2 of the second organic host h2.

The hole control layers 130 and 180 and the electron transport layers 150 and 200 of the first and second stacks, the charge generation layer 160, and the second electrode 210 are commonly provided for each of the red, green, and blue sub-pixels R-sub, G-sub, and B-sub in a continuous manner. For example, a bank that defines the emission part of each sub-pixel may be provided at the interface between the sub-pixels. The above common layers are provided even for the bank.

Meanwhile, a hole injection layer 120 is provided between the first electrode 110 and the first hole control layer 130 of the first stack. In addition, a hole transport layer 170 may be further provided between the charge generation layer 160 and the second hole control layer 180 of the second stack.

In addition, an electron injection layer for assisting in the injection of electrons may be further provided between the second electron transport layer 200 and the second electrode 210. The electron injection layer may be formed so as to have a small thickness by depositing or sputtering LiF or Li$_2$O or an alkaline metal or an alkaline earth metal, such as Li, Ca, Mg, or Sm, before the second electrode 210 is formed.

The charge generation layer 160 may have an np junction structure including an n-type charge generation layer 163 and a p-type charge generation layer 165. The n-type charge generation layer 163 supplies a number of electrons that is insufficient for the first stack, and the p-type charge generation layer 165 supplies a number of holes that is insufficient for the second stack.

In addition, the emission layers of the sub-pixels include a first red-light emission layer 141 and a second red-light emission layer 191 located in the first stack and the second stack on the first electrode 110 of the red sub-pixel R-sub to emit red light, a first green-light emission layer 142 and a second green-light emission layer 192 located in the first stack and the second stack on the first electrode 110 of the green sub-pixel G-sub to emit green light, and a first blue-light emission layer 143 and a second blue-light emission layer 193 located in the first stack and the second stack on the first electrode 110 of the blue sub-pixel B-sub to emit blue light.

In this case, the first red-light emission layer 141, the first green-light emission layer 142, and the first blue-light emission layer 143 may have successively smaller thicknesses in that order, and the second red-light emission layer 191, the second green-light emission layer 192, and the second blue-light emission layer 193 may have successively smaller thicknesses in that order. That is, the first red-light emission layer 141 is thickest among the first light emission layers 141, 142, 143 and the first blue-light light emission layer 141 is thinnest among the first light emission layers 141, 142, 143. The same color emission layers may have the same thickness. Depending on the circumstances, the first stack and the second stack may be different from each other in terms of the thicknesses of the emission layers. In any case, however, the emission layers have different thicknesses in the above-described order within the same stack. This relates to resonance conditions of each emission layer.

Particularly, in the organic light-emitting display device according to the present invention, the first and second red-light emission layers 141 and 191 are thicker than the emission layers that emit other colors, and the emission zone thereof may be defined in a portion thereof, rather than the entirety thereof. In the case in which the first and second organic compounds and the dopant having the characteristics previously described with reference to FIGS. 3 and 4 and in which the first organic host included in the emission layer of the first stack is configured so as to be identical to the host component constituting the electron transport layer that abuts the emission layer of the first stack, the emission zone may be optimized. In addition, in the case in which the red-light emission layer, which is thick, is configured so as to include the first and second organic hosts of the emission layer of the present invention, the greatest effect is achieved. Furthermore, in the case in which the characteristics of the present invention are applied to the emission stack of each of the first and second stacks that is near the first electrode (the anode), a more excellent effect is achieved.

Meanwhile, the reason that the characteristics of the present invention are applied to the red sub-pixel, rather than the sub-pixels for other colors, is that the effect is the greatest when the red emission layer is the thickest. In the case in which the thickness of the emission layer is changed for some other reason, the first and second organic hosts and the dopant having the above-described characteristics may be applied to the emission layer of the sub-pixel that is the thickest.

Hereinafter, the effects of the organic light-emitting display device according to the present invention obtained through experiments will be described.

TABLE 1

| Structure | | | | | | | | External |
|---|---|---|---|---|---|---|---|---|
| Host of Emission layer | Ratio (h1:h2) | Voltage | Current density | Luminance | Illuminance | CIEx | CIEy | quantum efficiency (%) |
| Comparative Example | 100% h2 | 8.9 | 4.6 | 55.4 | 19.5 | 0.693 | 0.303 | 71.8 |
| Examples | 2:1 | 7.8 | 3.5 | 70.8 | 28.6 | 0.698 | 0.300 | 94.5 |
| | 1:1 | 7.4 | 3.0 | 88.0 | 37.5 | 0.690 | 0.306 | 92.6 |
| | 1:2 | 7.9 | 3.3 | 78.3 | 31.3 | 0.692 | 0.305 | 87.3 |
| | 1:4 | 8.4 | 4.3 | 58.3 | 23.4 | 0.698 | 0.300 | 84.5 |

In the experiments, the red sub-pixel having the structure of FIG. 5 is used, and each of the first and second red-light emission layers of the first and second stacks includes first and second organic hosts h1 and h2 and a dopant. Here, the second organic host h2 is a Be derivative compound having an electron mobility of 6E-10 cm$^2$/V·s to 9E-10 cm$^2$/V·s, and the first organic host h1 is an electron transport material having an electron mobility of 1E-8 cm$^2$/V·s to 1E-6 cm$^2$/V·s. In addition, a material having a band gap of 3.0 eV to 3.5 eV and having a LUMO level of −2.32 eV and a HOMO level of −5.59 eV when applied to the first red-light emission layer is used as the first organic host h1. At this time, a material having a LUMO level of −2.5 eV and a HOMO level of −5.35 eV is used as the second organic host h2. In addition, the HOMO level of the hole control layer abutting thereto is −5.6 eV.

In the above experiments, the same material is used. In the experiment of Comparative Example, the percentage of the second organic host h2 is 100%. In the second to fifth experiments of Examples, the ratio of the first host to the second host is 2:1, 1:1, 1:2, and 1:4, respectively. That is, the amount of the second organic host is gradually increased.

In the second to fifth experiments of Examples, it can be seen that drive voltage and luminance are higher than in Comparative Example. That is, when the amount of the first host is 1, the amount of the second host can be changed from 0.5 to 4. When two hosts falling within this range are used to configure the emission layer, it is effective.

Meanwhile, the emission layer includes a dopant, in addition to the first and second organic hosts. When the total amount of the first and second organic hosts and the dopant is 100%, the amount of the dopant is 10% or less. That is, the amount of the dopant is less than that of any one of the first and second organic hosts. A small amount of dopant relates to a light emission wavelength, and does not affect the optimal emission zone obtained by the first and second organic hosts.

Meanwhile, when the amounts of the first and second organic hosts are the same in the above experiments, it can be seen that the effects of drive voltage reduction and luminance improvement are the greatest compared to Comparative Example.

Figure 6:
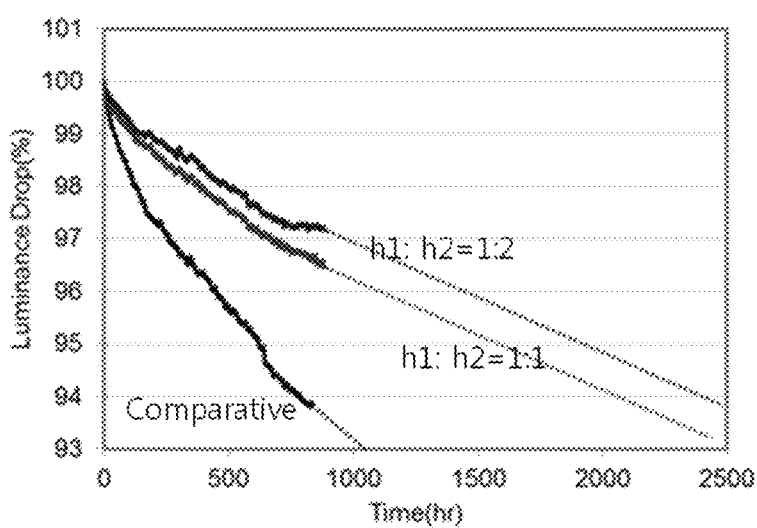
FIG. 6 is a graph showing the lifespan of Comparative Example and Examples depending on the change in luminance.

FIG. 6 is a graph showing the lifespan of Comparative Example, and Examples (of the present invention) depending on the change in luminance.

Examples of FIG. 6 are the third and fifth examples in Table 1 according to the present invention. It can be seen that, when the luminance is lowered to 93% of the initial luminance, the lifespan is increased by 2.5 times, compared to Comparative Example.

This improvement in lifespan is understood to result from shifting of the region in which holes and electrons meet each other to the center of the emission zone over time, described with reference to FIG. 4, thereby preventing electrons or excitons from accumulating at the interface of the emission layer and thus preventing the lifespan from being deteriorated.

In addition, an experiment was carried out on the change in voltage at a node of the first electrode over time in Comparative Example and Example of the present invention. In this experiment, Example is the third example in Table 1, and the amounts of the first and second organic hosts are the same.

In Comparative Example, the voltage at the node of the first electrode is changed by 0.5 V or more after the lapse of 240 hours. In Example, the voltage at the node of the first electrode is changed by 0.2 V after the lapse of 240 hours. Consequently, it can be seen that the change in the drive voltage is considerably small. This means that, in Example, the device is stabilized, whereby the reliability of the device is improved.

It can be seen through the above experiments that, in a multi-stack structure having an emission layer for each stack, an electron transport host having high electron mobility is included in the emission layer, which is widened as the optical distance is adjusted through the emission layer, in addition to a host that assists in operating a dopant, whereby balancing between holes, which are supplied rapidly, and electrons is optimized. Depending on the circumstances, the same may apply to a structure including three or more stacks.

In addition, an electron transport host included in the emission layer is made of the same material as an electron transport layer that abuts thereto such that ohmic contact is induced at the interface between the emission layer and the electron transport layer, whereby it is possible to increase the speed at which electrons are supplied to the emission layer. Furthermore, drive voltage is reduced through the smooth injection of electrons, and the recombination rate of electrons and holes, which are supplied rapidly, is increased, whereby light emission efficiency is improved.

In the organic light-emitting device according to the present invention and the organic light-emitting display device using the same, therefore, electron injection efficiency is improved to thus prevent electrons from accumulating at the interface between the emission layer and a layer adjacent thereto, thereby improving the reliability of the device and increasing the lifespan of the device.

As is apparent from the above description, an organic light-emitting device according to the present invention and an organic light-emitting display device using the same have the following effects.

First, in a multi-stack structure having an emission layer for each stack, an electron transport host having high electron mobility is included in the emission layer, which is widened as the optical distance is adjusted through the emission layer, in addition to a host that assists in operating a dopant, whereby balancing between holes, which are supplied rapidly, and electrons is optimized.

Second, an electron transport host included in the emission layer is made of the same material as an electron transport layer that abuts thereto such that ohmic contact is induced at the interface between the emission layer and the electron transport layer, whereby it is possible to increase the speed at which electrons are supplied to the emission layer. Furthermore, drive voltage is reduced through the smooth injection of electrons, and the recombination rate of electrons and holes, which are supplied rapidly, is increased, whereby light emission efficiency is improved.

Third, electron injection efficiency is improved, thus preventing electrons from accumulating at the interface between the emission layer and a layer adjacent thereto, thereby improving the reliability of the device and increasing the lifespan of the device.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Accordingly, various embodiments disclosed in the present invention are not intended to limit the technical sprit of the present invention, and the scope of the technical sprit of the present invention is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

What is claimed is:

1. An organic light-emitting device comprising:
   a first electrode and a second electrode opposite the first electrode;
   a first stack and a second stack provided between the first electrode and the second electrode, each of the first and second stacks comprising a hole control layer, an emission layer, and an electron transport layer, which are sequentially stacked; and
   a charge generation layer provided between the first stack and the second stack, wherein:
   the emission layers of the first and second stacks emit light have a same color, the emission layer of at least one of the first and second stacks comprising first and second organic hosts and a dopant,
   the second organic host assists in operating the dopant, and the first organic host controls a balance between holes and electrons, a lowest unoccupied molecularorbital (LUMO) energy level of the first organic host is at least 0.1 eV higher than a LUMO energy level of the second organic host, and a highest occupied molecularorbital (HOMO) energy level of the first organic host is equal to or higher than a HOMO energy level of the hole control layer, which abuts thereto, and is lower than a HOMO energy level of the second organic host, wherein the second organic host is a Be derivative compound, wherein the first organic host in the emission layer is identical to a host component constituting the electron transport layer, which abuts the emission layer, wherein the first organic host has a band gap of 3.0 eV to 3.5 eV, and wherein a ratio of the first organic host to the second organic host is 1:0.5 to 1:4.

2. The organic light-emitting device according to claim 1, further comprising:

a hole injection layer provided between the first electrode and the hole control layer of the first stack; and a hole transport layer provided between the charge generation layer and the hole control layer of the second stack.

3. The organic light-emitting device according to claim 1, wherein:

an electron mobility of the first organic host is higher than an electron mobility of the second organic host, and the electron mobility of the first organic host is 1E-8 cm$^2$/V·s to 1E-6 cm$^2$/V·s.

4. An organic light-emitting display device comprising:

a substrate having a red sub-pixel, a green sub-pixel, and a blue sub-pixel;

a first electrode provided at each of the red, green, and blue sub-pixels;

a second electrode opposite the first electrode;

a first stack and a second stack provided between the first electrode and the second electrode of each of the sub-pixels, each of the first and second stacks comprising a hole control layer, an emission layer, and an electron transport layer, which are sequentially stacked;

and a charge generation layer provided between the first stack and the second stack, wherein the emission layers of each of the sub-pixels comprise:

a first red-light emission layer and a second red-light emission layer respectively located in the first stack and the second stack on the first electrode of the red sub-pixel to emit red light;

a first green-light emission layer and a second green-light emission layer respectively located in the first stack and the second stack on the first electrode of the green sub-pixel to emit green light; and a first blue-light emission layer and a second blue-light emission layer respectively located in the first stack and the second stack on the first electrode of the blue sub-pixel to emit blue light, wherein:

at least one of the first red-light emission layer and the second red-light emission layer comprises first and second organic hosts and a red dopant, the second organic host assists in operating the red dopant, and the first organic host controls a balance between holes and electrons, a lowest unoccupied molecularorbital energy level of the first organic host is at least 0.1 eV higher than a LUMO energy level of the second organic host, a highest occupied molecularorbital energy level of the first organic host is equal to or higher than a HOMO energy level of the hole control layer, which abuts thereto, and is lower than a HOMO energy level of the second organic host, wherein the hole control layers and the electron transport layers of the first and second stacks, the charge generation layer, and the second electrode are commonly provided for each of the red, green, and blue sub-pixels in a continuous manner, wherein a ratio of the first organic host to the second organic host is 1:0.5 to 1:4, and wherein the second organic host is a Be derivative compound.

5. The organic light-emitting display device according to claim 4, wherein:

the first red-light emission layer, the first green-light emission layer, and the first blue-light emission layer have smaller thicknesses in that order, and the second red-light emission layer, the second green-light emission layer, and the second blue-light emission layer have smaller thicknesses in that order.

6. The organic light-emitting display device according to claim 4, wherein the first organic host in the first red-light emission layer is identical to a host component constituting the electron transport layer of the first stack, which abuts the first red-light emission layer.

7. The organic light-emitting display device according to claim 4, wherein the first organic host has a band gap of 3.0 eV to 3.5 eV.

8. The organic light-emitting display device according to claim 4, wherein:

an electron mobility of the first organic host is higher than electron mobility of the second organic host, and the electron mobility of the first organic host is 1E-7 cm$^2$/V·s to 1E-8 cm$^2$/V·s.

9. The organic light-emitting display device according to claim 4, wherein the first red-light emission layer is configured the same as the second red-light emission layer.

10. The organic light-emitting display device according to claim 4, further comprising:

a hole injection layer provided between the first electrode and the hole control layer of the first stack; and a hole transport layer provided between the charge generation layer and the hole control layer of the second stack.

11. The organic light-emitting display device according to claim 4, wherein at least one of the first green-light emission layer and the second green-light emission layer comprises the first organic host, a third organic host and a green dopant, the lowest unoccupied molecular orbital energy level of the first organic host is at least 0.1 eV higher than a LUMO energy level of the third organic host, and the highest occupied molecular orbital energy level of the first organic host is equal to or higher than the HOMO energy level of the hole control layer, which abuts thereto, and is lower than a HOMO energy level of the third organic host.

12. The organic light-emitting display device according to claim 4, wherein at least one of the first blue-light emission layer and the second blue-light emission layer comprises the first organic host, a fourth organic host and a blue dopant, the lowest unoccupied molecular orbital energy level of the first organic host is at least 0.1 eV higher than a LUMO energy level of the fourth organic host, and the highest occupied molecular orbital energy level of the first organic host is equal to or higher than the HOMO energy level of the hole control layer, which abuts thereto, and is lower than a HOMO energy level of the fourth organic host.

13. An organic light-emitting display device comprising:
a substrate having a red sub-pixel, a green sub-pixel, and a blue sub-pixel;
a first electrode provided at each of the red, green, and blue sub-pixels;
a second electrode opposite the first electrode;
a first stack and a second stack provided between the first electrode and the second electrode of each of the sub-pixels, each of the first and second stacks comprising a hole control layer, an emission layer, and an electron transport layer, which are sequentially stacked; and
a charge generation layer provided between the first stack and the second stack,
wherein the emission layers of each of the sub-pixels comprise:
a first red-light emission layer and a second red-light emission layer respectively located in the first stack and the second stack on the first electrode of the red sub-pixel to emit red light;
a first green-light emission layer and a second green-light emission layer respectively located in the first stack and the second stack on the first electrode of the green sub-pixel to emit green light; and
a first blue-light emission layer and a second blue-light emission layer respectively located in the first stack and the second stack on the first electrode of the blue sub-pixel to emit blue light,
wherein the hole control layers and the electron transport layers of the first and second stacks, the charge generation layer, and the second electrode are commonly provided for each of the red, green, and blue sub-pixels in a continuous manner, and
wherein:
at least one of the first red-light emission layer and the second red-light emission layer comprises first and second organic hosts and a red dopant,
the second organic host is a Be derivative compound to assist in operating the red dopant, and
the first organic host controls a balance between holes and electrons, and a lowest unoccupied molecular orbital energy level of the first organic host is at least 0.1 eV higher than a LUMO energy level of the second organic host.

* * * * *